United States Patent [19]

Tyran

[11] 4,331,714

[45] May 25, 1982

[54] PROCESS OF MAKING FLAKE SILVER POWDERS WITH CHEMISORBED MONOLAYER OF DISPERSANT

[75] Inventor: Leo W. Tyran, Lewiston, N.Y.

[73] Assignee: E. I. DuPont de Nemours and Company, Wilmington, Del.

[21] Appl. No.: 106,250

[22] Filed: Dec. 21, 1979

Related U.S. Application Data

[62] Division of Ser. No. 53,197, Jun. 29, 1979, Pat. No. 4,273,583.

[51] Int. Cl.$^3$ .............................................. B05D 7/00
[52] U.S. Cl. .................................... 427/216; 427/220; 252/512; 252/514; 106/1.19
[58] Field of Search ..................... 252/512, 514, 363.5, 252/314, 476, 448; 106/1.18, 1.19, 290; 75/251, 15 A, 118 R, 118 P; 427/216, 220, 191

[56] References Cited

U.S. PATENT DOCUMENTS 4,115,107  9/1978  Booz et al. ......................... 75/0.5 A
4,186,244  1/1980  Deffeyes et al. ................ 75/0.5 BA Primary Examiner—Joseph L. Schofer
Assistant Examiner—J. L. Barr

[57] ABSTRACT

Flake silver powders which have a chemisorbed monolayer of organic dispersing agent such as oleic acid on the surfaces and process for their preparation are provided. Such silver powders can be formulated into thick film pastes at above 85% solids levels at relatively low viscosities. Pastes so obtained, when printed and fired, result in films of excellent conductive efficiency.

6 Claims, No Drawings

PROCESS OF MAKING FLAKE SILVER POWDERS WITH CHEMISORBED MONOLAYER OF DISPERSANT

This is a division of application Ser. No. 53,197 filed Jun. 29, 1979 now U.S. Pat. No. 4,273,583.

DESCRIPTION

1. Technical Field

This invention relates to silver powders and more particularly to flake silver powders having oleic acid monolayer chemisorbed on the surface.

2. Background Art

Thick film silver compositions based on silver powders of various morphologies are old in the art and have been part of commerce for a long time.

Non-flake silver powders such as irregularly shaped or spherical silver powders have been prepared in the past but such powders, when formulated, printed and fired, result in relatively low electrical conductive efficiency. Non-flake silver powders have also been formulated in the presence of oleic acid, but conductive efficiency was not improved.

Conventional flake silver powders when formulated at above 85% solids loading often show poor screen printing characteristics because of excessive viscosity.

Addition of oleic acid during the formulation of these flake silver powders affords some improvement in the solids loading/viscosity relationship. Practically useful viscosity improvements are achieved when substantial portions of the flake silver powder is replaced by non-flake powder. Such a replacement, however, seriously impairs conductive efficiency.

There is a need in the electronic and automotive industries for silver powder which can be formulated into pastes at high (>85%) solids loading without such pastes reaching viscosities resulting in poor screen printing characteristics. At the same time it is necessary that the excellent electrical conductive efficiency inherent in flake silver powders be maintained.

DISCLOSURE OF THE INVENTION

The flake silver powder of this invention consists essentially of silver particles of flake morphology having at least a partial chemisorbed monolayer of hydrophobic organic dispersing agent such as oleic acid on the particle surfaces, wherein the dispersing agent contains at least one olefinic unsaturation and at least one carboxylic acid group.

The process for preparing the flake silver powder of this invention comprises the steps of:

(A) bead-milling of precipitated silver powder in a milling medium such as water in presence of sufficient organic dispersing agent containing at least one olefinic unsaturation and at least one carboxylic acid group to form a monolayer on at least one-third of the particle surfaces; and (B) separating the water and the beads from the resultant flake silver particles.

DESCRIPTION OF THE INVENTION

The flake silver powders of this invention are silver particles having a substantially complete monolayer of an organic dispersing agent chemisorbed on the particle surfaces. By substantially complete is meant a surface coverage sufficient to provide acceptable viscosities in the formulated pastes at high, i.e., above 85% by weight of the paste, solids levels. It has been found that when at least two-thirds of the particle surfaces have a chemisorbed monolayer of the dispersing agent, silver-based pastes of excellent screen-printing characteristics result. (By monolayer is meant a mono-molecular layer of the dispersing agent.)

By flake morphology is meant a silver powder whose predominant shape is flake as determined by scanning electron microscopy.

Generally, at least approximately 0.2% by weight of dispersing agent is required, based on the weight of the silver powder plus dispersing agent, for the formation of the required monolayer. Preferably, 0.2–0.5% by weight of dispersing agent is utilized. Above 1.5%, there is no additional beneficial effect observed. When the dispersing agent is oleic acid, 0.3% by weight of this material is most preferred.

The flake silver powders of this invention are prepared from irregularly shaped precipitated silver powders by bead-milling. Silver powder precipitation is well known and such powders are articles of commerce. A variety of such precursor powders are available which can be utilized in the inventive process. For example, silver powders having a solids content of 99.9%, bulk density range of 0.8–1.2 g/cm$^3$ (determined by a commercial volumeter), surface area range of 0.70–1.40 m$^2$/g (determined by BET Quantachrome Monosorb), and a particle size range of 1.0–1.5 microns (ASTM B-330-65) and powders having a solids content range of 99.72–100%, bulk density of 1.2 g/cm$^3$, surface area range of 0.95–1.65 m$^2$/g, and a particle size range of 1–4 microns, among others, are useful in producing the flake silver powders.

Bead-milling for the preparation of the flake silver powders is carried out in conventional milling equipment such as a ceramic milling jar utilizing glass beads of various diameters such as 3 mm or 6 mm. Milling time can also vary but usually a period between 48 and 66 hours has been found to be adequate. During this process the irregularly shaped precursor powder is converted to a flake morphology, its average particle size is reduced, and its particle size distribution is altered.

A measure of number average particle size is the value of the equivalent spherical diameter (ESD), at the 50% cummulative mass percent point. This can be calculated from particle size distribution curves determined by x-ray sedimentation (Sedigraph 5000 D particle size analyzer, Micromeritics Corporation, Norcross, Georgia). These values are shown below for two different precursor powders and the flake silver powders resulting from the process of this invention:

| ESD (at 50% point, µm) | |
|---|---|
| Precursor Powder | Flake Powder |
| 3.3 | 2.2–2.4 |
| 8 | 4.6–4.8 |

Water is generally employed as the milling medium and, since the product of the milling process, the flake silver powders with the chemisorbed monolayer of a hydrophobic dispersing agent on their surfaces, is not wet by the water, it can be conveniently separated from the silver-bead mixture. Draining or pumping of the water are effective means of isolating the solid materials.

The beads can be readily separated from the product silver by screening, the beads remaining on a coarse screen. The wet silver can then be air dried at 25°–110° C. and preferably at 70°–80° C. prior to final screening.

The sequence of the separating steps is not critical. The beads can be separated first followed by the separation of the water from the product silver.

The dispersing agent chemisorbed on the surfaces of the flake silver powders of this invention is introduced into the milling equipment prior to the bead-milling procedure. These dispersing agents are organic hydrophobic materials and contain at least two functional groups: at least one of each of olefinic unsaturation and carboxylic acid group.

It has been found unexpectedly, that in absence of either one of the above named groups such as with conventionally utilized dispersants in this art, for example, stearic acid and sodium stearate, no flake silver powders having the desired properties are obtained.

Although the exact mechanism of the chemisorption process is not known, it is believed that the double bond in such agents as oleic acid (cis-9-octadecenoic acid) interacts with the silver particle surface to form a strong chemisorptive bond. This allows the carboxylic group to remain substantially unassociated with the silver. As a result, the flake silvers of this invention have high dispersibility during formulation allowing high solids levels and sufficient hydrophobicity to prevent such wetting by water as would lead to water dispersibility. It was found that when the pH of oleic acid-treated flake silver powder was raised with aqueous sodium hydroxide, the powder became water dispersible because of the diminished hydrophobicity. Reacidification restored the desired hydrophobic properties.

When stearic acid (octadecanoic acid), having no double bonds in its structure, was utilized chemisorption could only occur at the carboxylic sites and the stearic acid could be readily removed from the silver surface by solvent extraction.

In a general selection procedure for useful dispersing agents, tests for dispersibility (viscosity versus solids levels in pastes) and conductive efficiency can be utilized. These, however, require more time than measurements of such physical properties of the product powders as bulk density, particle size and shape. These physical properties are also an effective measure of dispersing agent usefulness. When silver oleate, silver stearate, stearic acid, silver acetate, and $\beta$-terpineol were used as dispersing agents, the product silver powders did not have the flake morphology necessary for good conductive efficiency. When soya lecithin was used, irregular silver powder resulted in spite of the fact that it contains some oleic moeities and free acid functionality. It is believed that at the 0.3% level there was insufficient olefinic and acid functionality.

Among useful dispersing agents are oleic acid, linoleic acid, and linolenic acid.

The dispersing agents are quantitatively chemisorbed of the surface of the silver particles to form a monomolecular layer during the process of this invention and any excess dispersing agent is removable by methanol extraction.

When precursor silver powder is treated with excess (above approximately 0.3% by weight) oleic acid and bead-milled and the isolated powder is washed with methanol, a solids determination at 750° C. shows that only approximately 0.3–0.5% oleic acid remains adsorbed on the particle surfaces. In absence of the methanol washing step, substantially all of the charged oleic acid remains on the silver although not all of it chemisorbed in a monolayer.

The chemisorbed dispersing agent cannot readily be removed. A 66-hour methanol extraction in a Soxhlet extractor removed only approximately 17% by weight of the adsorbed oleic acid (0.3%, see above, leaving approximately 0.24%). The amount remaining corresponds, within experimental error, to the amount calculated as being necessary for monolayer formation: When adsorbed on $TiO_2$, oleic acid (molecular weight: 281) is known to cover a 20 $A^2$ surface area [W. D. Arkins, Journal of the American Chemical Society, 53, 2804 (1931)]. Assuming the same surface coverage by oleic acid on silver, one can calculate the weight of oleic acid in a mono-molecular layer on the surface of 100 grams of silver. Using a particular lot of flake silver powder of this invention, having a surface area of 0.67 $m^2/g$ (see Example 2), one obtains:

$$\frac{0.67 \text{ m}^2/\text{g} \times 100\text{g}}{20 \times 10^{-20} \text{ m}^2/\text{molecule}} \times \frac{1 \text{ mole}}{6.02 \times 10^{23} \text{ molecule}} \times$$

$$\frac{281\text{g}}{\text{mole}} = 0.16\text{g}.$$

This corresponds to approximately 0.16% by weight of oleic acid calculated to be required to form a monomolecular layer on the silver surface.

When the flake silver powder of this invention is formulated into conventional paste compositions, the viscosities are markedly improved (better dispersibility) when compared to pastes based on the precipitated precursor silver powders or on silver powders bead-milled in presence of soaps such as sodium stearate. Equivalent formulations were prepared at a calculated solids content of 89% by weight of the paste, containing 80% by weight of silver, 4% frit and 5% inorganic additive in an ethyl cellosolve acetate-$\beta$-terpineol vehicle. Viscosity was measured at 25° C. using a Brookfield HBT viscometer (spindle #5 at 10 rpm) and is shown below in Pascal seconds:

| Silver Powder | Viscosity |
| --- | --- |
| Run A (average of three preparations, with 0.3% oleic acid) | 73 |
| Run B (Type V-9 flake, available from E. I. du Pont de Nemours & Co.) | 1000 |
| Run C (Type C flake silver powder, available from Metz Metallurgical Corp.) | 140 |

The conductive efficiencies of the above-listed pastes were comparable, indicating that the flake silver powders of this invention afford screen printable pastes at higher solids loadings (at comparable viscosities) and therefore higher conductivity than possible with compositions based on conventional silver powders.

To determine conductive efficiency, the resistance of a fired 800 square serpentine pattern is measured at 25° C. The patterns can be screen printed by hand using a 200-mesh screen, air dried for 10–15 minutes, oven dried at 150° C. for 15 minutes and then fired in a belt furnace at 650° C. Resistance is measured by a conventional two-probe technique, and the weight of silver in the pattern is determined, after dissolution, by thiosulfate titration. Conductive efficiency is then calculated from the formula:

$$\frac{\frac{1}{\text{resistance (ohm)}}}{\text{weight of silver (g)}} = \frac{Mho}{g\ Ag}$$

Silver compositions based on the flake silver powders of this invention are useful, for example, as defoggers for automobiles and as microcircuit conductors.

EXAMPLES 1–7

These Examples, for the preparation of silver powders, are carried out as described above by a bead-milling process using water as the milling medium and various dispersing agents at different levels. Example 7, using stearic acid as a dispersing agent, is not within the scope of this invention.

|  | EXAMPLE 1 | EXAMPLE 2 |
|---|---|---|
| Dispersing Agent (% by weight) | oleic acid (0.1) | oleic acid (0.3) |
| Precursor Silver Powder |  |  |
| solids (% by weight) | 99.76 | 99.76 |
| surface area (m²/g) | — | 1.15 |
| Processing Conditions |  |  |
| milling time (hr.) | 64 | 64 |
| bead diameter (mm) | 6 | 6 |
| amount | 1000 cm³ | 144 kg |
| silver (weight) | 200 g | 50 kg |
| water (volume) | 500 ml | 144 l |
| Product Silver Powder |  |  |
| solids (% by weight) | 99.51 | 99.57 |
| bulk density (g/cm³) | 3.7 | 4.6 |
| surface area (m²/g) | 0.49 | 0.67 |
| predominant shape (scanning electron microscopy) | flake[1] | flake |

|  | EXAMPLE 3 | EXAMPLE 4 |
|---|---|---|
| Dispersing Agent (% by weight) | oleic acid (0.6) | oleic acid (1.5) |
| Precursor Silver Powder |  |  |
| solids (% by weight) | 99.72 | 99.84 |
| surface area (m²g) | 1.35 | 1.16 |
| Processing Conditions |  |  |
| milling time (hr.) | 64 | 64 |
| bead diameter (mm) | 6 | 6 |
| amount | 1000 cm³ | 1000 cm³ |
| silver (weight) | 200 g | 200 g |
| water (volume) | 500 ml | 500 ml |
| Product Silver Powder |  |  |
| solids (% by weight) | 99.33 | 98.34 |
| bulk density (g/cm³) | 2.6 | 2.5 |
| surface area (m²/g) | 0.80 | 0.61 |
| predominant shape (scanning electron microscopy) | flake | flake |

|  | EXAMPLE 5 | EXAMPLE 6 |
|---|---|---|
| Dispersing Agent (% by weight) | linoleic acid (0.3) | linoleic acid (0.3) |
| Precursor Silver Powder |  |  |
| solids (% by weight) | 99.80 | 99.80 |
| surface area (m²/g) | 1.24 | 1.24 |
| Processing Conditions |  |  |
| milling time (hr.) | 64 | 64 |
| bead diameter (mm) | 6 | 6 |
| amount | 3300 cm³ | 1000 cm³ |
| silver (weight) | 1500 g | 200 g |
| water (volume) | 4300 ml | 700 ml |
| Product Silver Powder |  |  |
| solids (% by weight) | 99.56 | 99.57 |
| bulk density (g/cm³) | 4.7 | 4.1 |
| surface area (m²/g) | 0.75 | 0.82 |
| predominant shape (scanning electron microscopy) | flake | flake |

|  | EXAMPLE 7 |
|---|---|
| Dispersing Agent (% by weight) | stearic acid (0.3) |
| Precursor Silver Powder |  |
| solids (% by weight) | 99.72 |
| surface area (m²/g) | 1.35 |
| Processing Conditions |  |
| milling time (hr.) | 64 |
| bead diameter (mm) | 6 |
| amount | 1000 cm³ |
| silver (weight) | 200 g |
| water (volume) | 700 ml |
| Product Silver Powder |  |
| solids (% by weight) | 99.46 |
| bulk density (g/cm³) | 5.3 |
| surface area (m²/g) | 0.76 |
| predominant shape (scanning electron microscopy) | chunks |

[1] visual observation

I claim:
1. A process for preparing flake silver powder comprising the steps of
   (a) preparing an admixture of precipitated silver powder, liquid milling medium, and at least 0.2% by weight hydrophobic unsaturated carboxylic acid,
   (b) bead-milling the admixture for a time sufficient to form a monolayer of the carboxylic acid on at least ⅔ of the particle surfaces, and
   (c) separating the liquid milling medium and beads from the resultant flake silver particles.
2. The process of claim 1 wherein the milling medium is water.
3. The process of claim 2 wherein said carboxylic acid is selected from the group consisting of oleic acid, linoleic acid, and linolenic acid.
4. The process of claim 3 wherein said carboxylic acid is oleic acid.
5. The process of claim 3 wherein the silver particles have a substantially complete monolayer of carboxylic acid chemisorbed on the particle surfaces.
6. The process of claim 1 wherein the carboxylic acid constitutes 0.2 to 1.5% by weight of the admixture.

* * * * *